(12) United States Patent
Kobayashi et al.

(10) Patent No.: US 7,713,886 B2
(45) Date of Patent: May 11, 2010

(54) FILM FORMING APPARATUS, FILM FORMING METHOD, PROGRAM AND STORAGE MEDIUM

(75) Inventors: Hirokatsu Kobayashi, Nirasaki (JP); Tetsuya Nakano, Nirasaki (JP); Masato Koizumi, Fuchu (JP)

(73) Assignee: Tokyo Electron Limited, Tokyo (JP)

( * ) Notice: Subject to any disclaimer, the term of this patent is extended or adjusted under 35 U.S.C. 154(b) by 41 days.

(21) Appl. No.: 11/741,939

(22) Filed: Apr. 30, 2007

(65) Prior Publication Data

US 2007/0204147 A1 Aug. 30, 2007

Related U.S. Application Data

(63) Continuation of application No. PCT/JP2005/019547, filed on Oct. 25, 2005.

(30) Foreign Application Priority Data

Oct. 28, 2004 (JP) ............................. 2004-313936

(51) Int. Cl.
*H01L 21/31* (2006.01)
*H01L 21/469* (2006.01)

(52) U.S. Cl. ............... 438/785; 438/792; 257/E21.477; 257/E21.478

(58) Field of Classification Search ................. 438/785, 438/792; 257/E21.477, E21.478
See application file for complete search history.

(56) References Cited

U.S. PATENT DOCUMENTS

| | | | | |
|---|---|---|---|---|
| 5,069,938 A | | 12/1991 | Lorimer et al. | |
| 5,366,585 A | * | 11/1994 | Robertson et al. | 216/67 |
| 5,648,113 A | * | 7/1997 | Barbee et al. | 427/8 |
| 6,027,629 A | * | 2/2000 | Hisamoto et al. | 205/50 |
| 6,106,634 A | * | 8/2000 | Ghanayem et al. | 134/19 |
| 6,271,129 B1 | * | 8/2001 | Ghanayem et al. | 438/675 |
| 2001/0006070 A1 | * | 7/2001 | Shang et al. | 134/1 |
| 2002/0009630 A1 | * | 1/2002 | Gao et al. | 429/34 |
| 2002/0011210 A1 | * | 1/2002 | Satoh et al. | 118/715 |
| 2002/0192370 A1 | * | 12/2002 | Metzner et al. | 427/248.1 |
| 2003/0015249 A1 | * | 1/2003 | Jursich | 141/4 |
| 2003/0180555 A1 | * | 9/2003 | Wakayama et al. | 428/472.2 |

(Continued)

FOREIGN PATENT DOCUMENTS

EP 0 460 700 A1 12/1991

(Continued)

*Primary Examiner*—Caridad M Everhart
(74) *Attorney, Agent, or Firm*—Oblon, Spivak, McClelland, Maier & Neustadt, L.L.P.

(57) ABSTRACT

Disclosed is a film forming method using a film forming gas composed of a metal alkoxide wherein clean film formation suppressed in contamination of a target substrate to be processed is achieved by restraining aluminum or an aluminum alloy in the processing chamber from dissolving. Specifically disclosed is method for forming a thin film on a target substrate to be processed which is held in a processing chamber, and this method comprises a step for heating the target substrate and a step for supplying a film forming gas into the processing chamber. This method is characterized in that the film forming gas is composed of a metal alkoxide, the processing chamber is made of aluminum or an aluminum alloy, and a protective film composed of a nonporous anodic oxide film is formed on the inner wall surface of the processing chamber.

18 Claims, 5 Drawing Sheets

U.S. PATENT DOCUMENTS

| | | | |
|---|---|---|---|
| 2004/0041286 A1* | 3/2004 | Lee et al. | 261/121.1 |
| 2004/0099215 A1* | 5/2004 | Danek et al. | 118/723 E |
| 2004/0151926 A1* | 8/2004 | Wada et al. | 428/472 |
| 2004/0250765 A1 | 12/2004 | Ishizaka et al. | |
| 2005/0045099 A1* | 3/2005 | Bencher et al. | 118/715 |
| 2005/0118737 A1 | 6/2005 | Takagi et al. | 438/14 |
| 2007/0148990 A1* | 6/2007 | DeBoer et al. | 438/778 |

FOREIGN PATENT DOCUMENTS

| | | |
|---|---|---|
| EP | 0 460 701 A1 | 12/1991 |
| JP | 4-263093 | 9/1992 |
| JP | 5-175147 | 7/1993 |
| JP | 6-283449 | 10/1994 |
| JP | 9-184094 | 7/1997 |
| JP | 9-302499 | 11/1997 |
| JP | 2001-262350 | 9/2001 |
| JP | 2003-007694 | 1/2003 |
| JP | 2004-124193 | 4/2004 |
| KR | 10-2004-0089683 | 10/2004 |

\* cited by examiner

FILM FORMING APPARATUS, FILM FORMING METHOD, PROGRAM AND STORAGE MEDIUM

This application is a Continuation Application of PCT International Application No. PCT/JP2005/019547 filed on 25 Oct. 2005, which designated the United States.

FIELD OF THE INVENTION

The present invention relates to a method of forming a thin film on a target substrate to be processed, a program for operating an apparatus for carrying out the method, and a storage medium for storing the program.

BACKGROUND OF THE INVENTION

A method of manufacturing a semiconductor device includes processes of, e.g., forming a thin film on a target substrate to be processed, etching the formed thin film, surface-treating the thin film and the like. A semiconductor device having a multilayer wiring structure is manufactured through these processes.

In a film forming apparatus employed in, e.g., the process of forming the film on the target substrate among these semiconductor manufacturing processes, the film formation is performed by supplying various gases related to the film formation into a processing chamber having therein the target substrate to be processed.

In the above film forming apparatus, the processing chamber having therein the target substrate is generally made of aluminum or an aluminum alloy. Since the aluminum or the aluminum alloy is light, easily worked, and relatively easily available, it has been widely used for making the processing chamber of the film forming apparatus. For example, in Patent Documents 1 and 2, an apparatus of which a processing chamber is made of aluminum or an aluminum alloy has been proposed. Further, Patent Documents 3 and 4 disclose methods of forming a nonporous anodic oxide film on a surface of aluminum or an aluminum alloy to provide the aluminum or an aluminum alloy of which a corrosion resistance is favorable and an amount of a discharge gas is small.

Patent Document 1: Japanese Patent Laid-open Application No. 2003-7694.

Patent Document 2: Japanese Patent Laid-open Application No. 2001-2623250.

Patent Document 3: Japanese Patent Laid-open Application No. H9-184094.

Patent Document 4: Japanese Patent Laid-open Application No. H9-302499.

However, the processing chamber made of aluminum or an aluminum alloy suffers from a problem in that, when specific gases are supplied to the processing chamber, the aluminum forming the processing chamber is eluted and the eluted aluminum is scattered to be attached to the target substrate to contaminate the target substrate.

For example, when a gas composed of a metal alkoxide is supplied to the processing chamber, there has been a problem in that aluminum is eluted to a great extent, entailing the possibility of the target substrate being contaminated by aluminum or metals contained in an aluminum alloy.

SUMMARY OF THE INVENTION

It is, therefore, an object of the present invention to provide a novel and useful film forming apparatus, a film forming method, a program for operating the film forming apparatus carrying out the method, and a storage medium for storing the program, thereby solving the above problem.

Specifically, an object of the present invention is to enable carrying out clean film formation by suppressing the elution of aluminum or aluminum alloy and preventing the contamination of a target substrate to be processed in the film forming method using a film forming gas composed of a metal alkoxide.

In accordance with a first aspect of the invention, the above object is achieved by a method of forming a thin film on a target substrate to be processed held in a processing chamber, the method including the steps of:

heating the target substrate; and supplying a film forming gas into the processing chamber, wherein the film forming gas is composed of a metal alkoxide; the processing chamber is made of aluminum or an aluminum alloy; and a protective film, which is formed of a nonporous anodic oxide film, is formed on an inner wall of the processing chamber.

In accordance with a second aspect of the invention, the above object is achieved by a computer executable program for operating a method of forming a thin film on a target substrate to be processed held in a processing chamber by a film forming apparatus, wherein the processing chamber is made of aluminum or an aluminum alloy; and a protective film, which is formed of a nonporous anodic oxide film, is formed on an inner wall of the processing chamber, the program including the steps of:

heating the target substrate, and supplying a film forming gas composed of a metal alkoxide into the processing chamber.

In accordance with a third aspect of the invention, the above object is achieved by a storage medium storing the program.

In accordance with a fourth aspect of the invention the above object is achieved by an apparatus for forming a thin film on a target substrate to be processed, the apparatus including:

a processing chamber, made of aluminum or an aluminum alloy, and including a holder for holding the target substrate;

a film forming gas supply unit that supplies a film forming gas composed of a metal alkoxide into the processing chamber; and a heating unit installed in the processing chamber, wherein an inner wall of the processing chamber is heated to a temperature of equal to or greater than 140° C. by the heating unit, and a protective film formed of a nonporous anodic oxide film is formed on the inner wall of the processing chamber.

In accordance with a fifth aspect of the invention, the above object is achieved by an apparatus for forming a thin film on a target substrate to be produced held in a processing chamber, the apparatus including:

a control unit performing the steps of heating the target substrate by using a heating unit for heating the target substrate, and supplying a film forming gas composed of a metal alkoxide into the processing chamber from a film forming gas supply unit, wherein the processing chamber is made of aluminum or an aluminum alloy, an inner wall of the processing chamber is heated to a temperature of equal to or greater than 140° C. and a protective film formed of a nonporous anodic oxide film is formed on the inner wall of the processing chamber.

In the film forming method using a film forming gas composed of a metal alkoxide, the elution of aluminum or an aluminum alloy in the processing chamber can be suppressed in accordance with the present invention. Therefore, the contamination of the target substrate can be prevented, thereby enabling the formation of a clean film.

DETAILED DESCRIPTION OF THE EMBODIMENTS

Hereinafter, embodiments of the present invention will be described in detail with reference to the accompanying drawings.

Figure 1:
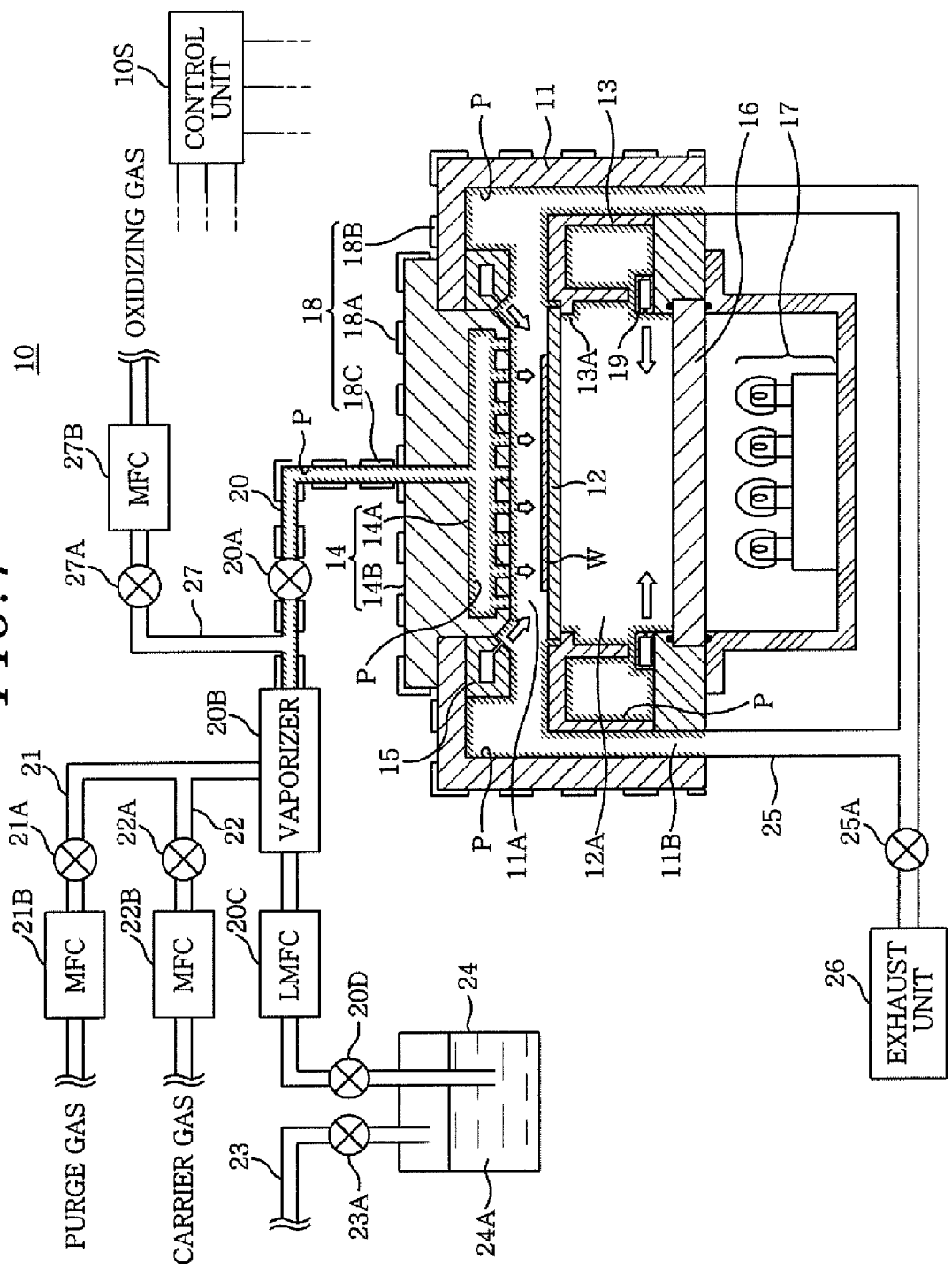
FIG. 1 is a schematic view showing a film forming apparatus for carrying out a film forming method in accordance with a first embodiment of the present invention.

FIG. 1 is a schematic view showing a film forming apparatus for carrying out a film forming method in accordance with a first embodiment of the present invention.

Referring to FIG. 1, a film forming apparatus 10 includes a processing chamber 11 made of aluminum or an aluminum alloy and having an approximately disc-shaped holder 12. The holder 12 is, e.g., made of ceramic and the like and holds a target substrate W, such as a semiconductor wafer or an LCD substrate. The holder 12 is supported by, e.g., a holder support 13, made of aluminum or an aluminum alloy, which is uprightly formed on a bottom surface of the processing chamber 11. Further, a purge gas supply unit 19, made of aluminum or an aluminum alloy, for discharging a purge gas to a space 12A which will be described later is mounted between the holder support 13 and the bottom surface of the processing chamber 11.

Further, a shower head unit 14 is mounted on an upper part of the processing chamber 11 to face the holder 12. The shower head unit 14 is made of aluminum or an aluminum alloy and supplies a film forming gas, which is the source material of a thin film formed on the target substrate W. A processing space 11A, which is supplied with the film forming gas, is formed between the shower head unit 14 and the holder 12.

The shower head unit 14 includes a gas supply unit 14A and a gas supply unit holding unit 14B to which the gas supply unit 14A is fitted and thus held thereby. Each of the gas supply unit 14A and the gas supply unit holding unit 14B are made of aluminum or aluminum alloy. The gas supply unit 14A has a film forming gas passage and a plurality of gas supply holes. The film forming gas passage is communicates with the processing space 11A through the gas supply holes. A gas line 20 is connected to the gas supply unit 14A, and thus the film forming gas is supplied from the gas line 20 to the processing space 11A through the gas supply holes.

Further, an exhaust port 11B is formed in the lower portion of the processing chamber 11, and an exhaust line 25 is connected to the exhaust port 11B. An exhaust unit 26, e.g., a vacuum pump is connected to the exhaust line 25 through a valve 25A, and thus the processing chamber 11 can be depressurized by vacuum exhaustion of the gases in the processing chamber 11.

Further, an opening part is provided in the bottom portion of the processing chamber 11 to face the holder 12, and, e.g., a transmission window 16 is installed in the opening part. Here, a heating unit 17 including, e.g., heating lamps is provided outside the processing chamber 11 of the transmission window 16, wherein the heating unit 17 heats the holder 12 and the target substrate W through the transmission window 16. Consequently, the temperature of the target substrate W can be controlled to be maintained at a predetermined temperature.

Further, since a purge gas, e.g., Ar, $N_2$ or the like is introduced from the purge gas supply unit 19 into a space 12A surrounded by the holder 12, the holder support 13, the transmission window 16 and the purge gas supply unit 19, the film forming gas is obstructed from infiltrating into the space 12A, thereby preventing deposits from adhering to walls, e.g., the top surface of the transmission window 16 and the like facing the space 12A.

Further, since a valve 20A is provided in the gas line 20 connected to the gas supply unit 14A of the shower head unit 14, it is possible to control the start and stop of the supply of the film forming gas. Furthermore, a vaporizer 20B for vaporizing source material composed of, e.g., liquid is provided in the gas line 20. Further, a source material container 24 storing a liquid source material 24A is connected to the vaporizer 20B through a liquid mass flow controller 20C and a valve 20D, which are provided in the gas line 20. The source material 24A is extruded by a pressurized gas, e.g., He or the like supplied through a gas line 23, which is connected to a source material container 24 and provided with a valve 23A. The source material 24A is supplied to the vaporizer 20B with its flow rate is controlled by the liquid mass flow controller 20C. The supplied source material 24A turns into a film forming gas after being vaporized in the vaporizer 20B, and the film forming gas is supplied through the shower head unit 14 to the processing space 11A together with a carrier gas, e.g., Ar or the like, supplied from a carrier gas line 22 connected to the vaporizer 20B.

A valve 22A and a mass flow controller 22B are installed on the carrier gas line 22. Therefore, it is possible to control the flow rate of the carrier gas supplied to the vaporizer 20B, or to control the start/stop of the supply of the carrier gas.

Further, a purge gas line 21 for supplying a purge gas, e.g., Ar or the like, is connected to the vaporizer 20B, and a valve 21A and a mass flow controller 21B are installed on the purge gas line 21. Accordingly, it is possible to control the flow rate of the purge gas supplied to the vaporizer 20B, and to control the start/stop of the supply of the purge gas.

Further, the gas line 20 is connected to a gas line 27 having a valve 27A and a mass flow controller 27B supplying an oxidizing gas, e.g., $O_2$ or the like, into the processing space 11A to oxidize the film forming gas. Accordingly, it is possible to supply the oxidizing gas into the processing space 11A.

Further, an approximately ring-shaped cleaning gas inlet unit 15, which is made of aluminum or an aluminum alloy, is formed around the shower head unit 14. Accordingly, it is possible to clean an inside of the processing chamber 11 by introducing a cleaning gas, e.g., $ClF_3$, $NF_3$ or the like, into the processing space 11A.

When a film forming process is performed by using the film forming apparatus 10 in accordance with the embodiment of the present invention, a source material composed of, e.g., liquid, is vaporized to be used. Therefore, it is preferable that the shower head unit 14 and/or the processing chamber 11 is heated before being used in order to prevent the vaporized source material from condensing. Accordingly, the film forming apparatus 10 has a heating unit 18 including, e.g., heaters to heat the film forming apparatus 10, thereby suppressing the condensation of the film forming gas.

For example, the heating unit 18 includes a heating unit 18A provided at the shower head unit 14, a heating unit 18B provided at the processing chamber 11, and a heating unit 18C provided at the gas line 20. Further, if necessary, another heating unit may be added in order to prevent the condensation of the film forming gas.

In the film forming apparatus 10 in accordance with the embodiment of the present invention, a metal alkoxide is used as the source material 24A. The metal alkoxide has a property of eluting aluminum from aluminum or an aluminum alloy. For this reason, in case that the material including the aluminum or an aluminum alloy is used to manufacture a processing chamber, a shower head unit, a gas line or the like in the conventional film forming apparatus, there has been a problem in that a thin film formed on a target substrate is contaminated with the aluminum or the aluminum alloy eluted by the metal alkoxide. Furthermore, the elution of the aluminum is more activated, especially at a high temperature. In the embodiment of the present invention, in which a source material composed of liquid is vaporized to be used, the processing chamber or the like is preferably used while being heated, as described above. Accordingly, prevention of aluminum elution is an important issue.

Accordingly, in the film forming apparatus 10 in accordance with the embodiment of the present invention, a protective film P for preventing the elution of a metal component, e.g., aluminum, by the metal alkoxide is formed on, e.g., the inner wall of the processing chamber 11. The protective film P is formed of, e.g., a nonporous anodic oxide film of aluminum or an aluminum alloy.

For example, in general, the film, referred to as the anodic oxide film, is a porous anodic oxide film. The porous anodic oxide film has a problem in that, since it is porous, the amount of a discharge gas is increased in a depressurized atmosphere, and the elution of aluminum by the metal alkoxide is insufficiently suppressed. Therefore, it is difficult to efficiently prevent the elution of aluminum even though such film is formed on the surface of the aluminum or the aluminum alloy. Meanwhile, the nonporous anodic oxide film in accordance with the embodiment of the present invention has a lower porosity than the conventional porous anodic oxide film. Therefore, the nonporous anodic oxide film of the invention has a feature of very effectively suppressing the elution of aluminum by the film forming gas from the inner wall of the processing chamber due to the use of the metal alkoxide. In this case, it is preferable that the porosity is 5% or less to obtain the increased effect of suppressing the elution of aluminum.

This nonporous anodic oxide film can be formed on the surface of aluminum or an aluminum alloy through the following processes.

First, it is preferable to perform a pretreatment to a surface of a material on which a protective film is to be formed, e.g., the inner wall of a processing chamber, to remove oils and fats, which are adhered to the surface of the material, and a nonuniform oxidation film.

Next, a protective film formed of a nonporous anodic oxide film is formed on the surface of the material by anodizing the pretreated material in an electrolyte solution. In this case, it is preferable to use an electrolyte solution, in which boric acid, borate, phosphate, adipate or the like is dissolved, which cannot easily dissolve the protective film and can also form the nonporous anodic oxide film.

Further, the film can be uniformly formed without precipitation and an uneven film is hardly formed by setting an electrolyte concentration in the electrolyte solution within a proper range.

In this case, when the material is immersed in the electrolyte solution, the material made of aluminum or an aluminum alloy is continuously or intermittently connected to a power source to serve as an anode and then electrolyzed. An insoluble conductive material is used as a cathode.

The anodic oxide film formed through the above processes has a very low porosity; that is, the anodic oxide film is substantially nonporous. In this case, it is preferable that its porosity be 5% or less. The nonporous anodic oxide film thus formed produces a small amount of a gas under depressurization, and can prevent the elution of aluminum from the surface of the material made of aluminum, an aluminum alloy or the like by a film forming gas such as a metal alkoxide or the like.

Further, in this case, it is preferable to bake the material on which the film is formed at a temperature of about 300° C. for example to reduce the amount of water included in the film.

Further, in this case, by fluorinating the surface of the nonporous anodic oxide film to form a fluorinated layer, a corrosion resistance of the nonporous anodic oxide film becomes improved, and the effect of suppressing the elution of aluminum from the surface of the material by, e.g., metal alkoxide is suitably increased. In order to fluorinate the surface of the nonporous anodic oxide film, various methods can be used. For example, the fluorinated layer can be formed on the surface of the nonporous anodic oxide film through a method of exposing the surface of the material to fluorine gas diluted with nitrogen or argon gas at a temperature of about 300° C., or through a method of exposing the surface of the material to a fluorine plasma, thereby increasing the resistance to the metal alkoxide.

As described above, in the film forming apparatus 10 in accordance with the embodiment of the present invention, the protective film P which is formed of the nonporous anodic oxide film is formed on the inner wall of the processing chamber 11. Therefore, in the film forming method using a film forming gas formed of the metal alkoxide, the elution of aluminum or an aluminum alloy in the processing chamber is suppressed, and the contamination of the target substrate is prevented, thereby enabling to form a clean film.

Further, this protective film P may also be formed, e.g., on a part inside the processing chamber 11, which can be exposed to the film forming gas, without being limited to the inner wall of the processing chamber 11, to suppress the elution of aluminum.

It is preferable that the protective film P be formed on the part that can be exposed to the film forming gas, e.g., the part and the like facing the processing space 11A in the processing chamber 11 such as the holder support 13, the shower head unit 14 and the like. Further, it is also preferable to form the protective film P on the surfaces of the cleaning gas inlet unit 15 and the purge gas supply unit 19 as well.

Further, in case of the shower head unit 14, it is also preferable to form the protective film P on the inner wall of the plurality of gas supply holes and the film forming gas passage connecting the gas supply holes with the gas line 20, in addition to the parts facing the processing space 11A in the processing chamber 11.

Moreover, in case the gas line 20 is made of, e.g., aluminum or an aluminum alloy, the elution of aluminum by the metal alkoxide can be suitably suppressed by forming the protective film P on the inner wall of the gas line 20. That is, the nonporous anodic oxide film can also be formed on a portion, e.g., an inner wall of a gas inlet passage, that can contact the metal alkoxide which is a vaporized film forming gas, not just on the inner wall and inner parts of the processing chamber, thereby also suppressing the elution of aluminum.

Further, in the embodiment of the present invention, e.g., pentaethoxy tantalum (PET, $Ta(OC_2H_5)_5$) can be used as the material formed of a metal alkoxide. In this case, it is possible to form a $Ta_2O_5$ film on the target substrate by using $O_2$ as an oxidizing gas.

Further, in the embodiment of the present invention, in addition to the above example, hafnium tetra-t-butoxide (Hf $(O-t-C_4H_9)_4$) or zirconium tetra-iso-propoxide (Zr(O-i-$C_3H_7)_4$) can be used as a film forming gas composed of a metal alkoxide. In such a case, it is possible to form an $HfO_2$ film or a $ZrO_2$ film on a target substrate.

Further, in the film forming apparatus 10, the operation for the film formation is controlled by a control unit 10S having therein a storage medium and a computer (CPU). For example, the opening and closing of the valves 20A, 20D, 21A, 22A, 23A, 27A and the like, the heating unit 17, the maintaining and changing of heating temperature by the heating unit 17, and the operation of the liquid mass flow controller 20C and the mass flow controllers 21B, 22B, 27B and the like are controlled by the control unit 10S. Further, the operation of the control unit 10S is executed by a program stored in the storage medium.

Figure 2:
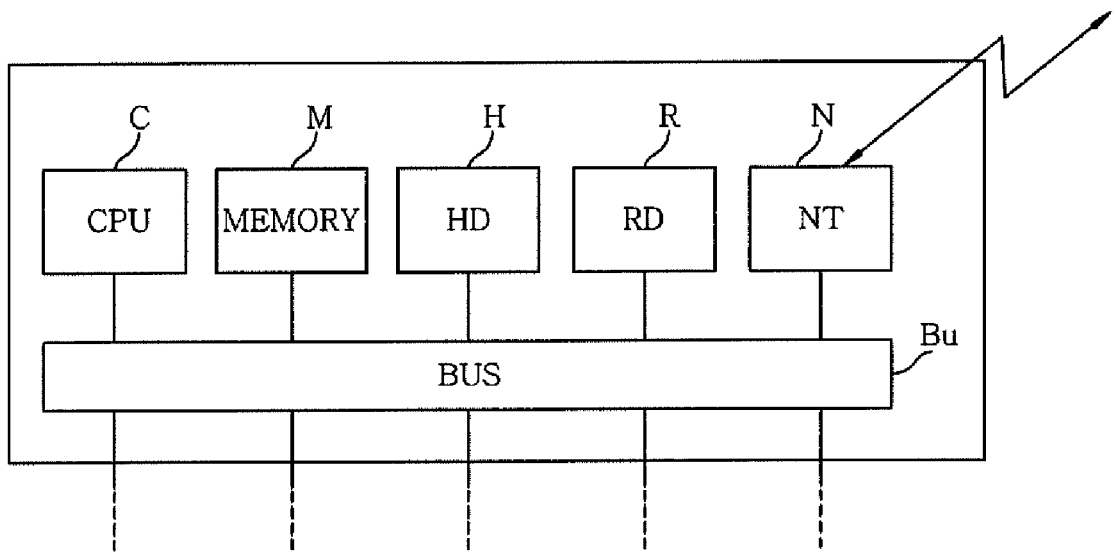
FIG. 2 is a schematic view showing a control unit used in the film forming apparatus of the first embodiment.

FIG. 2 is a schematic view showing a control unit 10S. Referring to FIG. 2, the control unit 10S includes a CPU (computer) C, a memory M, a storage medium H, e.g., a hard disk, a removable storage medium R, a network interface unit N, and a bus Bu connecting these constituents. Further, the bus Bu is configured to be connected to the valves and the heating unit. A program for operating a film forming apparatus is stored in the storage medium H, but the program may alternatively be inputted by the removable storage medium R or the network interface unit N.

When a process of forming a thin film, such as a $Ta_2O_5$ film or the like, is performed on a target substrate by using the film forming apparatus 10, the control unit 10S operates the film forming apparatus 10 by the program (referred to as a recipe) stored in the storage medium H, as shown below.

Figure 3:
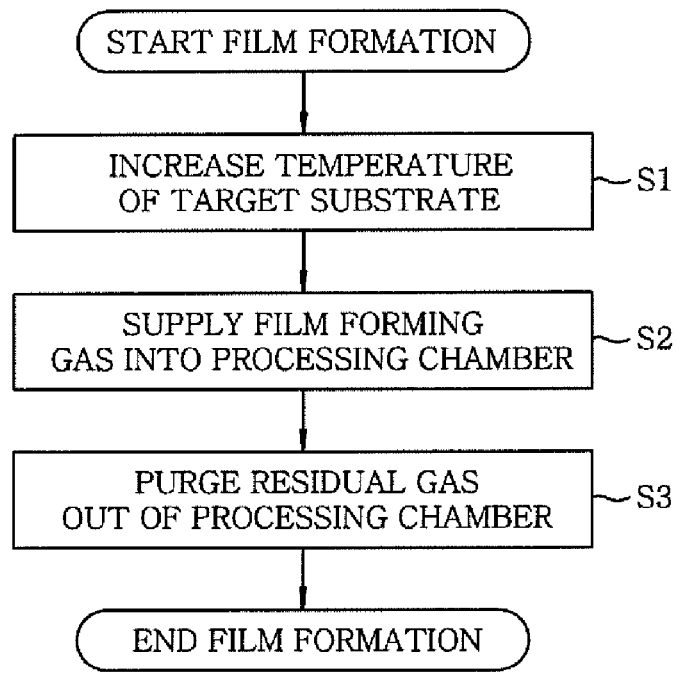
FIG. 3 is a flow chart showing the film forming method in accordance with the first embodiment.

For example, FIG. 3 is a flow chart showing a specific operation in the case where the $Ta_2O_5$ film is formed by the film forming apparatus 10.

Referring to FIG. 3, when a film forming process starts, in step S1, the target substrate W, which is held on the holder 12, is heated by the heating unit 17, and the target substrate W is maintained at a temperature within the range, e.g., from 250° C. to 450° C.

Next, in step S2, the valves 23A, 20D and 20A are opened and the source material 24A including, e.g., pentaethoxy tantalum is supplied to the vaporizer 20B by supplying a pressurized gas, e.g., He through the gas line 23 to the source material container 24. The pentaethoxy tantalum, vaporized by the vaporizer 20B, serves as a film forming gas, and is supplied to the processing space 11A through the shower head unit 14. In this case, the flow rate of the source material 24A supplied to the vaporizer 20B is controlled by the liquid mass flow controller 20C, thereby controlling the flow rate of the film forming gas. Further, in this case, the valve 22A is opened and the film forming gas is supplied to the processing space 11A together with a carrier gas, e.g., Ar.

Further, in this case, an oxidizing gas, e.g., $O_2$, is supplied through the gas line 27 to the processing space 11A, while the valve 27A is opened and the flow rate of the oxidizing gas is controlled by the mass flow controller 27B.

Here, the $Ta_2O_5$ film is formed on the target substrate by the reaction of the film forming gas and the oxidizing gas supplied on the heated substrate.

Further, in this case, the inside of the processing chamber 11 is exhausted through the exhaust line 25, and thus the processing space 11A is maintained at a pressure within the range, e.g., from 40 to 1332 Pa. Further, the target substrate is heated by using the heating unit 17 thereby being maintained at a temperature within the range from 250° C. to 450° C.

After carrying out the film formation for a predetermined period, in step S3, the valves 23A, 20D, 20A, 22A, and 27A are closed, and thus the supply of the film forming gas and the oxidizing gas is stopped. Gases remaining in the processing chamber 11 are then exhausted, and thus the film forming process is completed.

Further, the film forming method in accordance with the present invention is not limited to the above case. Other various film forming methods may be used. For instance, there can be employed a method wherein a film forming gas and an oxidizing gas are alternately supplied to the target substrate, that is, the supply and discharge of the film forming gas and the oxidizing gas are repeatedly performed so-called ALD.

Hereinafter, experimental results will be described with reference to FIGS. 4 to 7. The results were obtained by evaluating the effects of suppressing the elution of aluminum, in case that a protective film P formed of a nonporous anodic oxide film is formed on the surface of aluminum in the film forming apparatus in accordance with the embodiment of the present invention.

Figure 4:
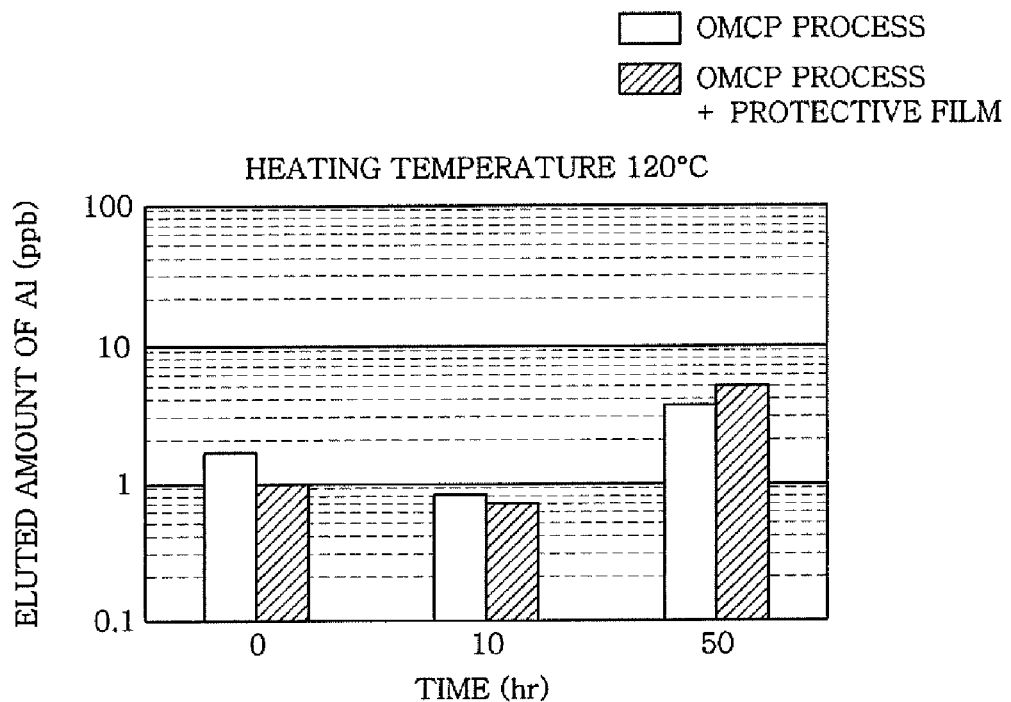
FIG. 4 is a first graph showing a result obtained by comparing amounts of eluted aluminum for cases of different aluminum surface treatments.
Figure 5:
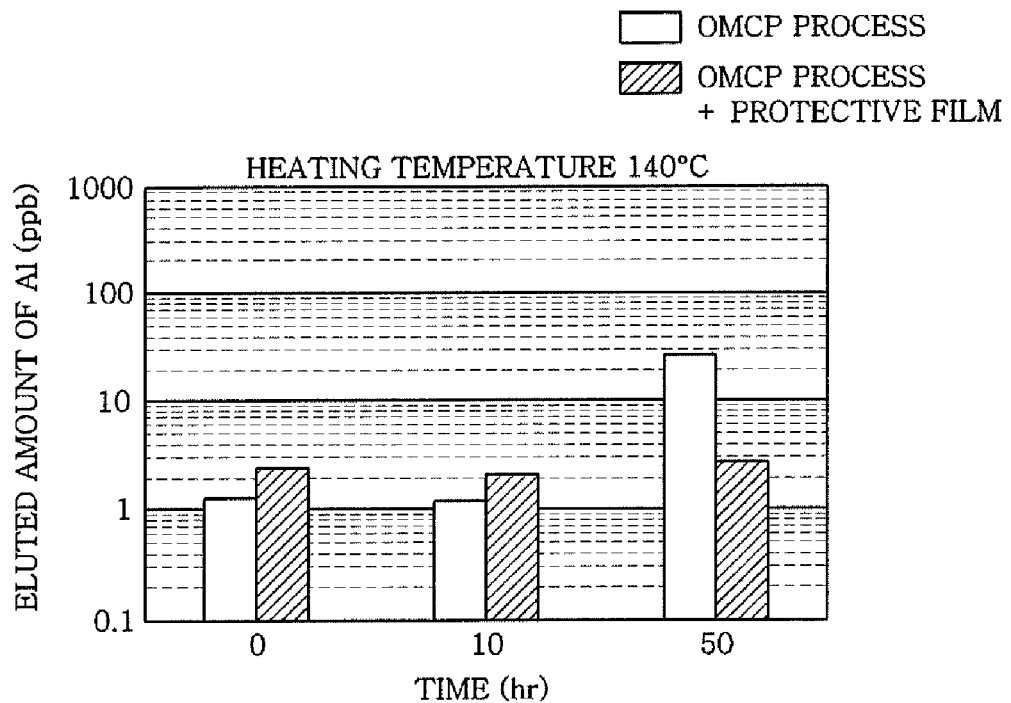
FIG. 5 is a second graph showing a result of comparing amounts of eluted aluminum for cases of different aluminum surface treatments.
Figure 6:
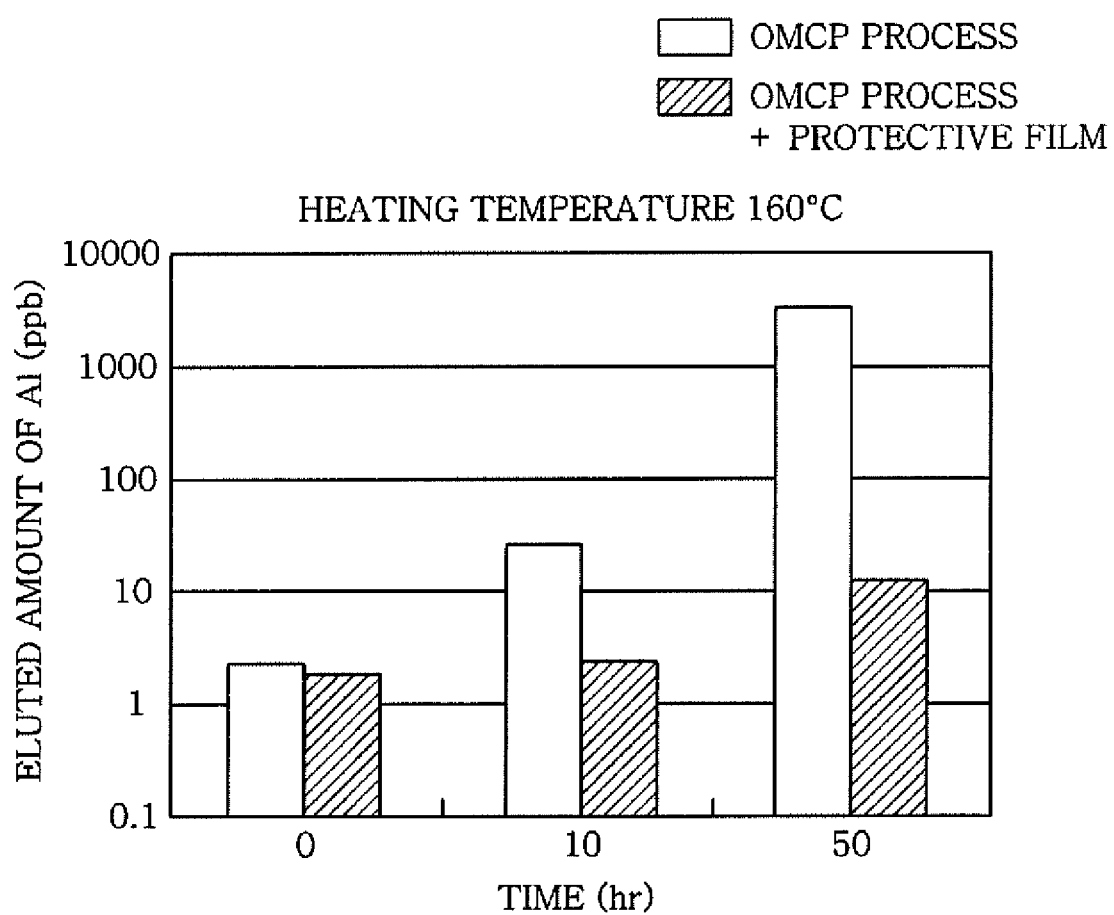
FIG. 6 is a third graph showing a result obtained by comparing amounts of eluted aluminum for cases of different aluminum surface treatments.

FIGS. 4 to 6 show results obtained by analyzing the increase in the concentration of aluminum eluted in the pentaethoxy tantalum (PET) solution depending on the lapse of time by using an ICP-MS (inductively-coupled plasma mass spectrometer), wherein aluminum samples were left in the pentaethoxy tantalum (PET) solution, which was heated to 120° C., 140° C. and 160° C., respectively. In each experiment, the amount of eluted aluminum in a case where the surface of the aluminum was polished by an organic-mechanical-chemical polishing (OMCP process) was compared with that in a case where the surface of the aluminum was polished by the OMCP process, and a protective film formed of the nonporous anodic oxide film was formed thereon.

Referring to FIGS. 4 to 6, data at a time of 0 are analyzed results about the PET solution before putting the aluminum sample therein. The amount of the eluted aluminum of 5 ppb or less is below the lowest quantitative detection limit of ICP-MS. In such a case therefore, some apparent data look better even though only the OCMP process was applied.

Referring to FIG. 4, the amount of the eluted aluminum is, satisfactorily, at most 5 ppb in both cases of performing both of the OMCP process and the nonporous anodic oxide film formation, and only the OMCP process.

Meanwhile, referring to FIGS. 5 and 6, when only the OMCP process was performed, and the heating temperature was above 140° C., the amount of eluted aluminum is above 10 ppb in the data where the samples were left for 50 hours. Further, when the heating temperature was 160° C., the amount of eluted aluminum is above 1000 ppb in the data where the sample was left for 50 hours. Accordingly, these results are not satisfactory.

In the case of performing the nonporous anodic oxide film formation in addition to the OMCP process, the amount of eluted aluminum is 10 ppb even when the sample was left at a heating temperature of 160° C. for 50 hours. Here, it can be seen that the amount of eluted aluminum in case of performing the OMCP process and the protective film formation is not greater than 1/100 of the amount of the eluted aluminum in case of performing only the OMCP process.

Further, referring to FIGS. 4 to 6, it can be seen that the amount of the eluted aluminum is increased with the increase of temperature.

As described above, it has been confirmed that the nonporous anodic oxide film has a property of protecting base aluminum or an aluminum alloy from the metal alkoxide, e.g., pentaethoxy tantalum, used as a film forming gas, and has an effect of suppressing the elution of aluminum. Therefore, in accordance with the film forming method of the embodiment, it can be seen that the elution of aluminum or the aluminum alloy in the processing chamber is suppressed, and the contamination of the target substrate is prevented, thereby enabling the clean film formation.

Specifically, in the film forming apparatus 10 shown in FIG. 1, it can be seen that, when the temperature of the surface of the aluminum, on which the protective film P is formed, is equal to or greater than 140° C., the elution of aluminum is suppressed, thereby enabling the clean film formation.

Figure 7:
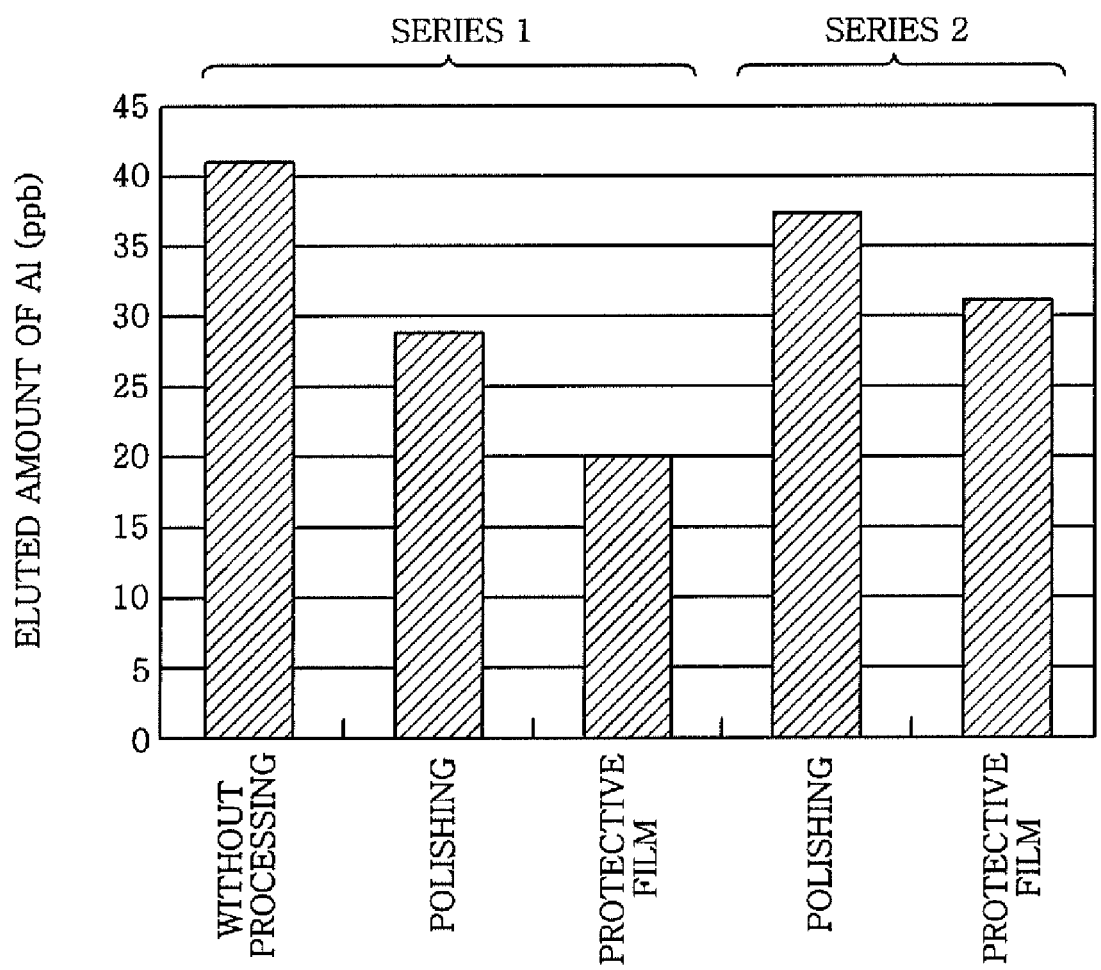
FIG. 7 is a fourth graph showing a result obtained by comparing amounts of eluted aluminum for cases of different aluminum surface treatments.

FIG. 7 shows results obtained by evaluating the amount of the eluted aluminum in diluted hydrochloric acid when an aluminum alloy was in contact with the diluted hydrochloric acid. Further, in a series 1, amounts of the eluted aluminum were compared to each other when various treatments on the surface of the aluminum alloy were performed by using an aluminum alloy according to A5052 in JIS standards. In a series 2, amounts of the eluted aluminum were compared to each other for cases where various treatments on the surface of the aluminum alloy were performed by using an aluminum alloy according to A1050 in JIS standards.

In the series 1, the amounts of the eluted aluminum from three cases were compared to each other: the first case is where the no surface treatment on the aluminum alloy was performed; the second case is where the surface was polished by the OMCP process; and the third case is where the surface was polished by the OMCP process and then a protective film, e.g., the nonporous anodic oxide film, was formed thereon. In the series 2, the amounts of the eluted aluminum for the two cases were compared to each other: the first case is where the surface of the aluminum alloy was polished by the OMCP process; and the second case is where the surface was polished by the OMCP process and then a protective film formed of the nonporous anodic oxide film was formed thereon.

Referring to FIG. 7, in the series 1, it can be seen that the amount of the eluted aluminum is suppressed more in the case where the surface of the aluminum alloy was polished through the OMCP process compared to the case where the no surface treatment of aluminum alloy was carried out. Moreover, it can be seen that the elution of aluminum is suppressed even more in the case where the protective film was formed. Similarly, in the series 2, it can be seen that the elution of aluminum is also suppressed more in the case where the protective film was formed on the surface of the aluminum alloy in comparison to the case where the surface of the aluminum was polished by the OMCP process.

As described above, it can be seen that the nonporous anodic oxide film also has corrosion resistance to hydrochloric acid. Accordingly, it can be seen the film forming apparatus 10 shown in FIG. 1 having such a structure that aluminum or an aluminum alloy is protected by the nonporous anodic oxide film has resistance to etching by halogen elements, e.g., chlorine and the like. Therefore, the etching of aluminum or an aluminum alloy by the halogen elements can be prevented, so that the elution of aluminum can be suppressed in a cleaning process using a cleaning gas including, e.g., the halogen elements, and the contamination of the target substrate can be prevented.

Although the present invention has been described in conjunction with the preferred embodiments, the invention is not limited to the above described specific embodiments; rather it can be changed or modified without departing from the scope of the accompanying claims.

INDUSTRIAL APPLICABILITY

In accordance with the present invention, in the film forming method using the film forming gas composed of the metal alkoxide, the elution of aluminum or an aluminum alloy in the processing chamber is suppressed, and the contamination of the target substrate is prevented, thereby enabling the formation of a clean film.

This international application claims the benefit of Japanese Patent Application No. 2004-313936, filed on Oct. 28, 2004, the entire disclosure thereof being incorporated herein by reference.

What is claimed is:

1. A method of forming a thin film on a target substrate to be processed held in a processing chamber, comprising:
 performing a pretreatment on a surface of a material of an inner wall of the processing chamber, the inner wall being made of aluminum or an aluminum alloy;
 forming a protective film formed of a substantially nonporous anodic oxide film on the surface of the material by anodizing the pretreated surface of the material in an electrolyte solution which includes boric acid, borate, phosphate or adipate;
 heating the target substrate;
 supplying a film forming gas into the processing chamber; and
 heating the inner wall of the processing chamber to a temperature of equal to or greater than 140° C.,
 wherein the film forming gas is composed of a metal alkoxide,
 wherein the processing chamber includes a shower head, for supplying the film forming gas into the processing chamber, and the surface of the material on which the pretreatment is performed and the protective film is formed includes a surface of the shower head,
 wherein the protective film has a porosity of 5% or less, and
 wherein the protective film produces a small amount of gas under depressurization and prevents an elution of aluminum from the surface of the material.

2. The method in accordance with claim 1, wherein the protective film includes a fluorinated layer.

3. The method in accordance with claim 1, wherein a holder for holding the target substrate and a holder support made of aluminum or an aluminum alloy for supporting the holder are provided in the processing chamber; and the protective film is formed on the holder support.

4. The method in accordance with claim 1, wherein a cleaning gas inlet unit made of aluminum or an aluminum alloy for cleaning an inside of the processing chamber is provided in the processing chamber; and the protective film is formed on the cleaning gas inlet unit.

5. The method in accordance with claim 1, wherein the target substrate is heated by a heating lamp provided at a side opposite to a side of a holder on which the target substrate is held.

6. The method in accordance with claim 1, wherein the metal alkoxide includes pentaethoxy tantalum.

7. The method in accordance with claim 1, wherein $O_2$ is introduced into the processing chamber together with the film forming gas.

8. The method in accordance with claim 1, wherein the thin film is a $Ta_2O_5$ film.

9. A storage medium storing a computer executable program for operating a method of forming a thin film on a target substrate to be processed held in a processing chamber by a film forming apparatus, wherein the processing chamber is made of aluminum or an aluminum alloy, the program comprising:
performing a pretreatment on a surface of a material of an inner wall of the processing chamber;
forming a protective film formed of a substantially nonporous anodic oxide film on the surface of the material by anodizing the pretreated surface of the material in an electrolyte solution which includes boric acid, borate, phosphate or adipate;
heating the target substrate,
heating the inner wall of the processing chamber to a temperature of equal to or greater than 140° C., and
supplying a film forming gas composed of a metal alkoxide into the processing chamber,
wherein the processing chamber includes a shower head, for supplying the film forming gas into the processing chamber, and the surface of the material on which the pretreatment is performed and the protective film is formed includes a surface of the shower head,
wherein the protective film has a porosity of 5% or less, and
wherein the protective film produces a small amount of gas under depressurization and prevents an elution of aluminum from the surface of the material.

10. The storage medium storing the program in accordance with claim 9, wherein the metal alkoxide includes pentaethoxy tantalum.

11. The storage medium storing the program in accordance with claim 9, wherein the program includes introducing $O_2$ into the processing chamber together with the film forming gas.

12. The storage medium storing the program in accordance with claim 9, wherein the thin film is a $Ta_2O_5$ film.

13. An apparatus for forming a thin film on a target substrate to be processed, comprising:
a processing chamber, made of aluminum or an aluminum alloy, and including a holder for holding the target substrate;
a film forming gas supply unit that supplies a film forming gas composed of a metal alkoxide into the processing chamber, the film forming gas supply unit including a shower head; and
a heating unit installed in the processing chamber,
an exhaust unit for depressurizing the processing chamber by vacuum exhaustion of gases in the processing chamber, the exhaust unit being connected to the processing chamber;
wherein an inner wall of the processing chamber is heated to a temperature of equal to or greater than 140° C. by the heating unit, a protective film formed of a substantially nonporous anodic oxide film is formed on a surface of a material of the inner wall of the processing chamber, the surface of the material including a surface of the shower head,
wherein the protective film is formed by performing a pretreatment on the surface of the material, and forming the protective film by anodizing the pretreated surface of the material in an electrolyte solution which includes boric acid, borate, phosphate or adipate,
wherein the protective film has a porosity of 5% or less, and
wherein the protective film produces a small amount of gas under depressurization and prevents an elution of aluminum from the surface of the material.

14. The apparatus in accordance with claim 13, wherein the metal alkoxide includes pentaethoxy tantalum.

15. The apparatus in accordance with claim 13, wherein the protective film includes a fluorinated layer.

16. The apparatus in accordance with claim 13, wherein a holder support made of aluminum or an aluminum alloy to support the holder is provided in the processing chamber; and the protective film is formed on the holder support.

17. The apparatus in accordance with claim 13, wherein a cleaning gas inlet unit made of aluminum or an aluminum alloy to clean an inside of the processing chamber is provided in the processing chamber; and the protective film is formed on the cleaning gas inlet unit.

18. An apparatus for forming a thin film on a target substrate to be produced held in a processing chamber, comprising:
a control unit performing the steps of heating the target substrate by using a heating unit for heating the target substrate, and supplying a film forming gas composed of a metal alkoxide into the processing chamber from a film forming gas supply unit, the film forming gas supply unit including a shower head,
wherein the processing chamber is made of aluminum or an aluminum alloy, an inner wall of the processing chamber is heated to a temperature of equal to or greater than 140° C. and a protective film formed of a substantially nonporous anodic oxide film is formed on a surface of a material of the inner wall of the processing chamber, the surface of the material on which the protective film is formed including a surface of the shower head,
wherein the protective film is formed by performing a pretreatment on the surface of the material, and forming the protective film by anodizing the pretreated surface of the material in an electrolyte solution which includes boric acid, borate, phosphate or adipate,
wherein the protective film has a porosity of 5% or less, and
wherein the protective film produces a small amount of gas under depressurization and prevents an elution of aluminum from the surface of the material.

* * * * *